US010867569B2

(12) United States Patent
Kawachi et al.

(10) Patent No.: US 10,867,569 B2
(45) Date of Patent: Dec. 15, 2020

(54) DISPLAY DEVICE

(71) Applicant: Panasonic Liquid Crystal Display Co., Ltd., Himeji (JP)

(72) Inventors: Genshirou Kawachi, Hyogo (JP); Kuniaki Amano, Hyogo (JP); Ryutaro Oke, Hyogo (JP); Daisuke Kajita, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 16/575,002

(22) Filed: Sep. 18, 2019

(65) Prior Publication Data
US 2020/0013358 A1 Jan. 9, 2020

Related U.S. Application Data

(63) Continuation of application No. PCT/JP2018/003188, filed on Jan. 31, 2018.

(30) Foreign Application Priority Data

Mar. 23, 2017 (JP) ................................. 2017-057040

(51) Int. Cl.
*G09G 3/36* (2006.01)
*H01L 27/12* (2006.01)
(Continued)

(52) U.S. Cl.
CPC ......... *G09G 3/3648* (2013.01); *G02F 1/1368* (2013.01); *G02F 1/13454* (2013.01);
(Continued)

(58) Field of Classification Search
None
See application file for complete search history.

(56) References Cited

U.S. PATENT DOCUMENTS

| 6,229,506 B1 | 5/2001 | Dawson et al. |
| 2007/0052646 A1* | 3/2007 | Ishiguchi ............. G09G 3/3696 345/92 |

(Continued)

FOREIGN PATENT DOCUMENTS

| JP | 1-219785 | 9/1989 |
| JP | 6-347753 | 12/1994 |

(Continued)

*Primary Examiner* — Sepehr Azari
(74) *Attorney, Agent, or Firm* — Hamre, Schumann, Mueller & Larson, P.C.

(57) ABSTRACT

A display device includes: pixel transistors electrically connected to the respective source lines and the respective gate lines; a monitor transistor in which a lead-out wiring of a drain electrode is electrically connected to a first external terminal, a lead-out wiring of a gate electrode is electrically connected to a second external terminal, and a lead-out wiring of a source electrode is electrically connected to a third external terminal; a reference transistor in which a lead-out wiring of a drain electrode is electrically connected to a fourth external terminal, a lead-out wiring of a gate electrode is electrically connected to a fifth external terminal, and a lead-out wiring of a source electrode is electrically connected to a sixth external terminal; and a detector electrically connected to the third external terminal and the sixth external terminal to detect a shift amount of a threshold voltage of the monitor transistor.

11 Claims, 17 Drawing Sheets

(51) Int. Cl.
*G02F 1/1345* (2006.01)
*G02F 1/1368* (2006.01)
*G02F 1/1362* (2006.01)

(52) U.S. Cl.
CPC ..... *G02F 1/136286* (2013.01); *G09G 3/3685* (2013.01); *H01L 27/124* (2013.01); *G09G 2300/0439* (2013.01)

(56) References Cited

U.S. PATENT DOCUMENTS

| | | | |
|---|---|---|---|
| 2011/0080173 A1* | 4/2011 | Kim | G09G 3/006 324/403 |
| 2014/0085172 A1 | 3/2014 | Wu et al. | |
| 2014/0091996 A1* | 4/2014 | Moon | G09G 3/3685 345/92 |
| 2015/0236687 A1 | 8/2015 | Shimada et al. | |
| 2016/0178768 A1* | 6/2016 | Tredwell | G01T 1/247 250/252.1 |
| 2017/0186369 A1* | 6/2017 | Hayashi | G09G 3/3233 |
| 2018/0218703 A1* | 8/2018 | Lee | G02F 1/136286 |

FOREIGN PATENT DOCUMENTS

| | | |
|---|---|---|
| JP | 7-333292 | 12/1995 |
| JP | 2001-281629 | 10/2001 |
| JP | 2007-072162 | 3/2007 |
| JP | 2016-111095 | 6/2016 |
| WO | 94/25954 | 11/1994 |
| WO | 2014/042116 | 3/2014 |

* cited by examiner

SURFACE SIDE
↕
BACK SURFACE SIDE

DISPLAY DEVICE

CROSS-REFERENCE TO RELATED APPLICATION

This application is a bypass continuation of international patent application PCT/JP2018/003188, filed on Jan. 31, 2018 designating the United States of America. Priority is claimed based on Japanese patent application JP 2017-057040, filed on Mar. 23, 2017. The entire disclosures of these international and Japanese patent applications are incorporated herein by reference in their entirety.

TECHNICAL FIELD

The present invention relates to a display device.

BACKGROUND ART

In a display device such as a liquid crystal display device, a thin film transistor (TFT) is used as a switching element. Conventionally, it has been known that a threshold voltage (Vth) of the thin film transistor is shifted due to changes in temperature environment, operating time, applied voltage, and the like. When the threshold voltage of the thin film transistor is shifted, switching operation becomes unstable, which results in degradation of display quality. For this reason, a technique of correcting the threshold voltage by detecting the threshold voltage of the thin film transistor has been proposed (for example, see U.S. Pat. No. 6,229,506).

SUMMARY OF THE INVENTION

Technical Problem

However, in the conventional technique, it is necessary to form a detection circuit constructed with a plurality of thin film transistors on a glass substrate in order to detect the threshold voltage, which causes a problem in that a circuit configuration becomes complicated.

The present invention has been made in view of the above problems, and an object thereof is to provide a display device that can detect a shift amount of the threshold voltage of the thin film transistor with a simple configuration.

Solution to Problem

According to a first aspect of the present invention, a display device includes: a plurality of source lines; a plurality of gate lines; a source driver that supplies a data signal to each of the plurality of source lines; a gate driver that supplies a gate signal to each of the plurality of gate lines; a plurality of pixel transistors electrically connected to the respective source lines and the respective gate lines; a monitor transistor in which a lead-out wiring of a drain electrode is electrically connected to a first external terminal, a lead-out wiring of a gate electrode is electrically connected to a second external terminal, and a lead-out wiring of a source electrode is electrically connected to a third external terminal; a reference transistor in which a lead-out wiring of a drain electrode is electrically connected to a fourth external terminal, a lead-out wiring of a gate electrode is electrically connected to a fifth external terminal, and a lead-out wiring of a source electrode is electrically connected to a sixth external terminal; and a detector that is electrically connected to the third external terminal and the sixth external terminal to detect a shift amount of a threshold voltage of the monitor transistor.

In the display device of the first aspect, preferably a first mode in which an image is displayed and a second mode in which the shift amount of the threshold voltage of the monitor transistor is detected are included, in the first mode, the data signal is applied to the drain electrode of the monitor transistor, the gate signal is applied to the gate electrode of the monitor transistor, and the lead-out wirings of the drain electrode and the gate electrode of the reference transistor are connected to a constant voltage source, and in the second mode, a predetermined voltage is applied to the drain electrode of each of the monitor transistor and the reference transistor, the lead-out wire of the gate electrode of each of the monitor transistor and the reference transistor is connected to a constant voltage source, and the detector detects the shift amount based on a drain current of each of the monitor transistor and the reference transistor.

Preferably the display device of the first aspect further includes a controller that applies a correction voltage to the plurality of pixel transistors based on the shift amount. The controller applies the correction voltage to the gate electrodes of the plurality of pixel transistors when the shift amount is larger than a first reference voltage.

In the display device of the first aspect, preferably the controller sets an application period of the correction voltage longer with increasing shift amount.

In the display device of the first aspect, preferably a signal waveform of the correction voltage has an inclined rising period and an inclined falling period.

In the display device of the first aspect, preferably the controller outputs a control signal to the source driver and the gate driver when the shift amount is larger than a first reference voltage, the source driver outputs a common voltage to the respective source lines only for a predetermined period when the source driver receives the control signal, and the gate driver outputs the correction voltage to the respective gate lines only for the predetermined period when the gate driver receives the control signal.

In the display device of the first aspect, preferably the processing of applying the correction voltage to the gate electrode of each of the plurality of pixel transistors using the controller is performed after an operation to power off the display device is received.

In the display device of the first aspect, preferably in processing of applying the correction voltage to the gate electrode of each of the plurality of pixel transistors using the controller, the controller sequentially supplies the correction voltage to the plurality of gate lines.

In the display device of the first aspect, preferably the plurality of source lines, the plurality of gate lines, the source driver, the gate driver, the plurality of pixel transistors, the monitor transistor, and the reference transistor are provided in a display panel, and the detector is provided outside the display panel.

In the display device of the first aspect, preferably the monitor transistor and the reference transistor are disposed close to each other in a non-display region of the display panel.

In the display device of the first aspect, preferably a first mode in which an image is displayed and a second mode in which the shift amount of the threshold voltage of the monitor transistor is detected are included, in the first mode, the data signal is applied to the drain electrode of the monitor transistor, the gate signal is applied to the gate electrode of the monitor transistor, and the lead-out wirings of the drain electrode and the gate electrode of the reference transistor are connected to a constant voltage source, and in the second mode, the drain electrode and the gate electrode of the monitor transistor are electrically connected to each other while electrically connected to a constant current source, the drain electrode and the gate electrode of the reference transistor are electrically connected to each other while electrically connected to the constant current source, and the detector detects the shift amount based on a drain voltage of each of the monitor transistor and the reference transistor.

According to a second aspect of the present invention, a display device includes: a plurality of source lines; a plurality of gate lines; a source driver that supplies a data signal to each of the plurality of source lines; a gate driver that supplies a gate signal to each of the plurality of gate lines; a plurality of pixel transistors electrically connected to the respective source lines and the respective gate lines; a monitor transistor in which a lead-out wiring of a drain electrode is electrically connected to a first external terminal, a lead-out wiring of a gate electrode is electrically connected to a second external terminal, and a lead-out wiring of a source electrode is electrically connected to a third external terminal; and a detector that is electrically connected to the third external terminal to detect a shift amount of s threshold voltage of the monitor transistor.

According to a third aspect of the present invention, a display device includes: a plurality of source lines; a plurality of gate lines; a source driver that supplies a data signal to each of the plurality of source lines; a gate driver that supplies a gate signal to each of the plurality of gate lines; a plurality of pixel transistors electrically connected to the respective source lines and the respective gate lines; a plurality of pixel electrodes electrically connected to each of the plurality of pixel transistors; and a plurality of monitor transistors. Each of the plurality of pixel transistors and the plurality of monitor transistors includes a gate electrode, a semiconductor layer, a source electrode, and a drain electrode that are made of an identical material in an identical layer, and the plurality of monitor transistors are not electrically connected to the plurality of pixel electrodes.

In the display device of the third aspect, the plurality of pixel transistors are formed in a display region, and the monitor transistor is formed in a non-display region.

In the display device of the third aspect, the monitor transistor is not electrically connected to the source driver and the gate driver.

The display device according to the present disclosure can detect a shift amount of the threshold voltage of the thin film transistor with a simple configuration.

Hereinafter, an exemplary embodiment of the present disclosure will be described with reference to the drawings. In the exemplary embodiment, a liquid crystal display device is described as an example of display device. However the present disclosure is not limited to the liquid crystal display device. For example the present disclosure may be an organic electroluminescence display (OLED) device.

Figure 1:
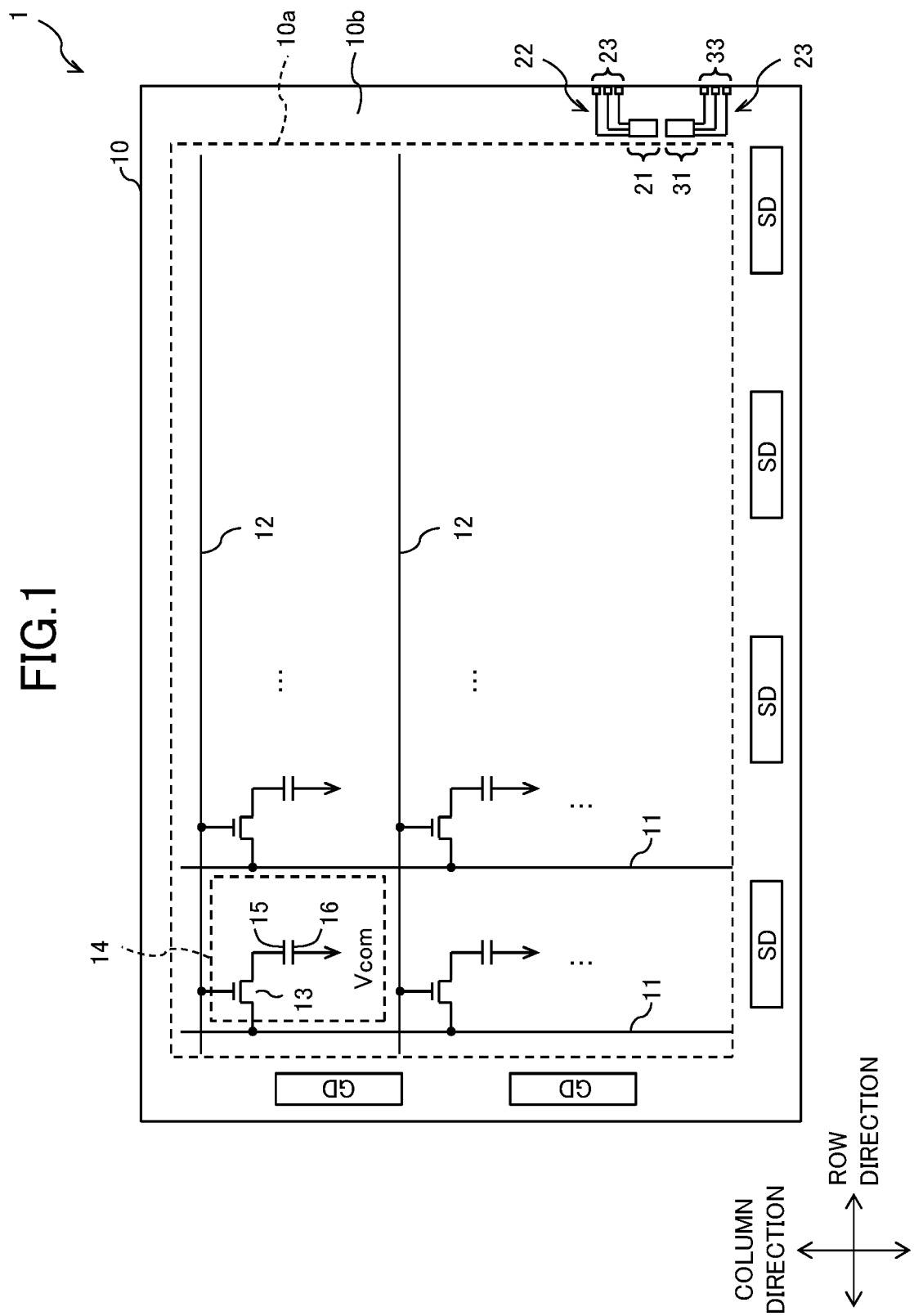
FIG. 1 is a plan view illustrating a schematic configuration of the liquid crystal display device according to the exemplary embodiment.

FIG. 1 is a plan view illustrating a schematic configuration of the liquid crystal display device according to the exemplary embodiment. Liquid crystal display device 1 includes display panel 10, source driver SD (IC), gate driver SD (IC), and a backlight (not illustrated). Display panel 10 includes display region 10a where an image is displayed and non-display region 10b around display region 10a. Numbers of source driver SDs and gate driver GDs are not particularly limited.

A plurality of source lines 11 extending in a first direction (for example, a column direction) and a plurality of gate lines 12 extending in a second direction (for example, a row direction) are provided in display region 10a of display panel 10. Thin film transistor 13 (hereinafter, referred to as a pixel transistor) is provided at an intersection of each source line 11 and each gate line 12. Each source line 11 is electrically connected to source driver SD, and each gate line 12 is electrically connected to gate driver GD. A plurality of pixels 14 are arranged into a matrix shape (the row direction and the column direction) corresponding to the intersections of source lines 11 and gate lines 12. Pixel electrode 15 is electrically connected to pixel transistor 13, and common electrode 16 is disposed opposite to pixel electrode 15. A data signal (data voltage) is supplied from source driver SD to each source line 11, and a gate signal (a gate-on voltage and a gate-off voltage) is supplied from gate driver GD to each gate line 12. Common voltage Vcom is supplied from a common driver (not illustrated) to common electrode 16. When an on-voltage (gate-on voltage) of the gate signal is supplied to gate line 12, pixel transistor 13 connected to gate line 12 is turned on, and the data voltage is supplied to pixel electrode 15 through source line 11 connected to pixel transistor 13. An electric field is generated by a difference between the data voltage supplied to pixel electrode 15 and common voltage Vcom supplied to common electrode 16. Liquid crystal is driven by the electric field to control transmittance of light emitted from the backlight, thereby displaying an image. In performing color display, a desired data voltage is supplied to source line 11 connected to pixel electrode 15 of pixel 14 corresponding to each of red, green, and blue, which are formed by a stripe-shaped color filter.

Figure 2:
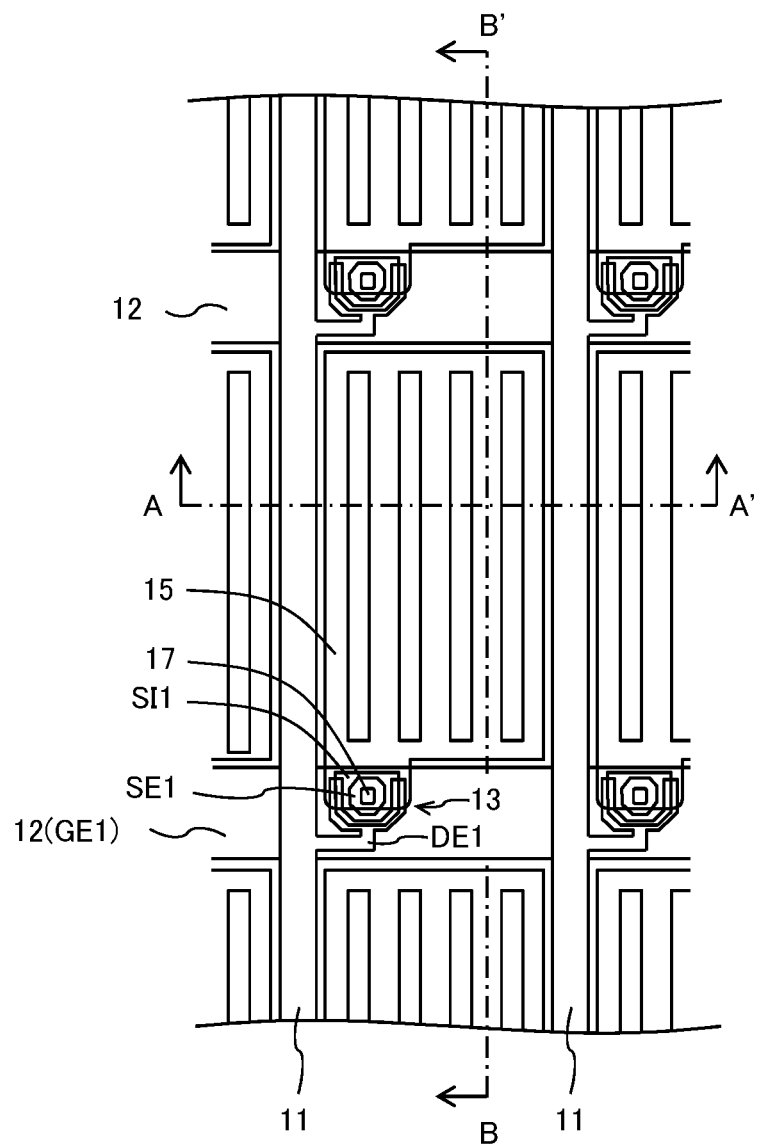
FIG. 2 is a plan view illustrating a configuration of pixel of the display panel according to the exemplary embodiment.
Figure 2:
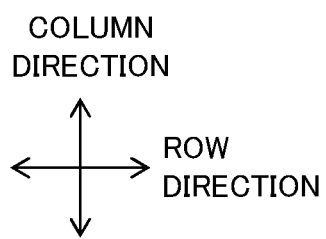
Figure 3:
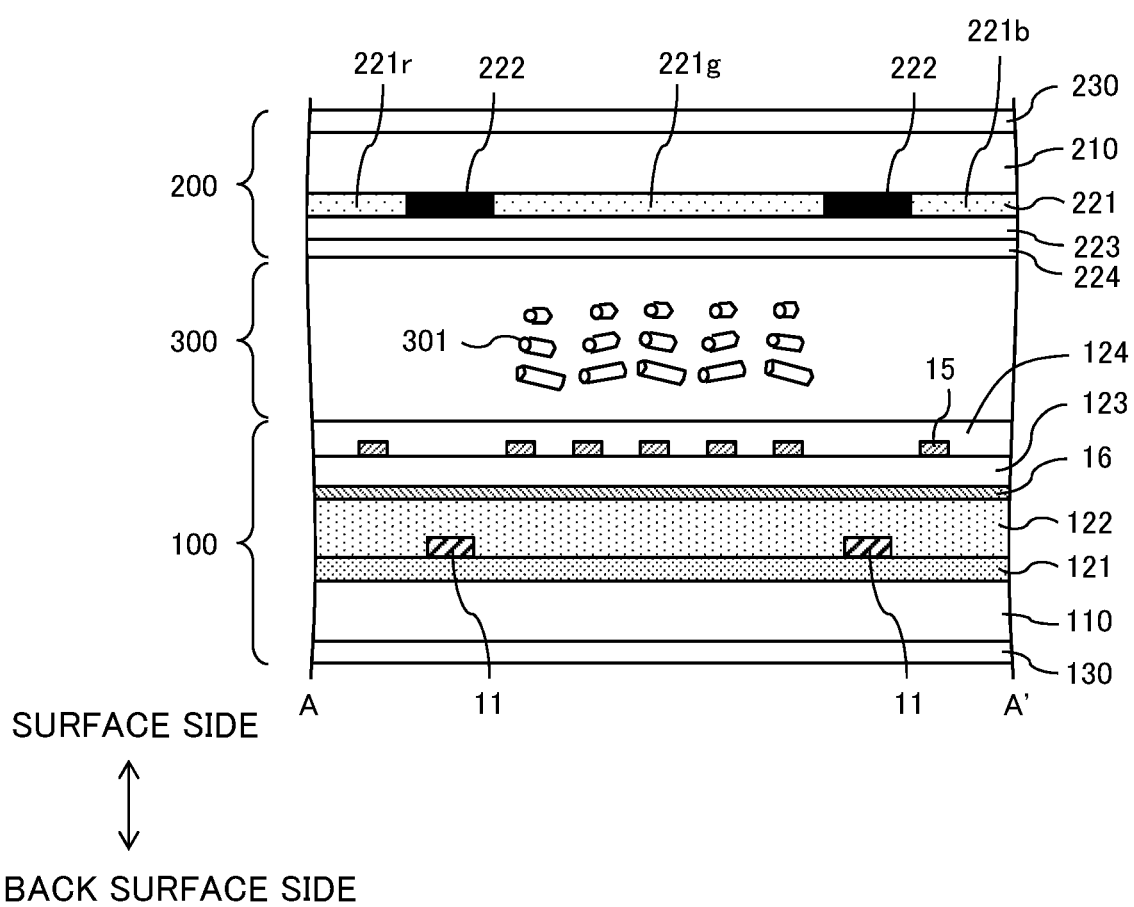
FIG. 3 is a sectional view taken along line A-A in FIG. 2.
Figure 4:
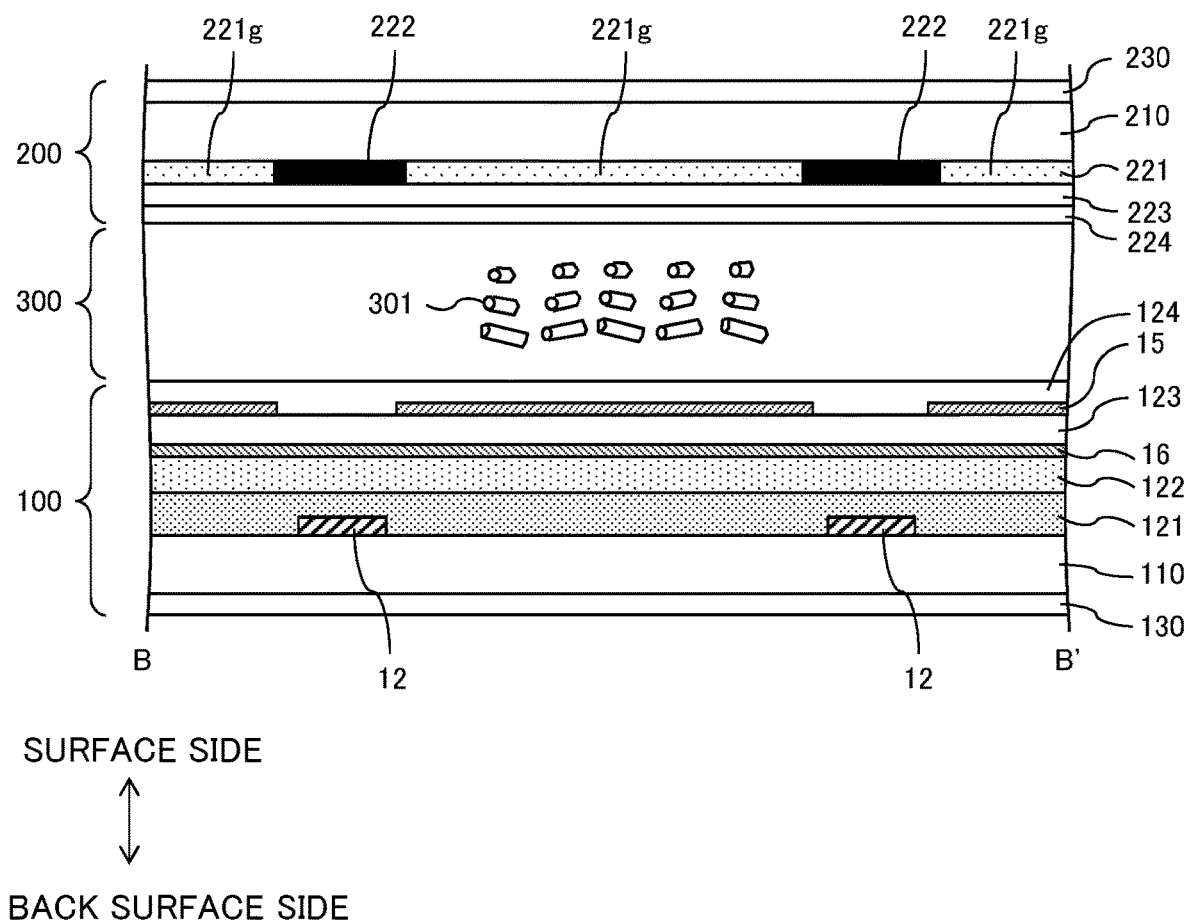
FIG. 4 is a sectional view taken along line B-B' in FIG. 2.

FIG. 2 is a plan view illustrating a configuration of pixel 14. FIG. 3 is a sectional view taken along line A-A in FIG. 2, and FIG. 4 is a sectional view taken along line B-B' in FIG. 2. A specific configuration of display panel 10 will be described with reference to FIGS. 2 to 4.

In FIG. 2, a region partitioned by two adjacent source lines 11 and two adjacent gate lines 12 corresponds to one pixel 14. Thin film transistor 13 is provided in each pixel 14. Pixel transistor 13 includes semiconductor layer SI1 formed on insulating film 121 (see FIG. 3), and drain electrode DE1 and source electrode SE1 that are formed on semiconductor layer SI1 (see FIG. 2). Drain electrode DE1 is electrically connected to source line 11, and source electrode SE1 is electrically connected to pixel electrode 15 through through-hole 17. Pixel electrode 15 made of a transparent conductive film such as indium tin oxide (ITO) is formed in each pixel 14. Pixel electrode 15 includes a plurality of openings (slits), and is formed into a stripe shape. One common electrode 16 made of a transparent conductive film such as ITO is formed in common to each pixel 14 over a display region.

As illustrated in FIGS. 3 and 4, display panel 10 includes thin film transistor substrate 100 disposed on a back surface side, color filter substrate 200 disposed on a display surface side, and liquid crystal layer 300 sandwiched between thin film transistor substrate 100 and color filter substrate 200.

In thin film transistor substrate 100, gate line 12 (see FIG. 4) is formed on the display surface side of glass substrate 110, and insulating film 121 is formed so as to cover gate line 12. Source line 11 (see FIG. 3) is formed on insulating film 121, and insulating film 122 is formed so as to cover source line 11. Common electrode 16 is formed on insulating film 122, and insulating film 123 is formed so as to cover common electrode 16. Pixel electrode 15 is formed on insulating film 123, and alignment film 124 is formed so as to cover pixel electrode 15. Polarizing plate 130 is formed on the back surface side of glass substrate 110.

In color filter substrate 200, black matrix 222 and color filter 221 (for example, red color filter 221r, green color filter 221g, and blue color filter 221b) are formed on the back surface side of glass substrate 210, and overcoat layer 223 is formed so as to cover black matrix 222 and color filter 221. Alignment film 224 is formed on overcoat layer 223. Polarizing plate 230 is formed on the display surface side of glass substrate 210.

Liquid crystal 301 is enclosed in liquid crystal layer 300. Liquid crystal 301 may be negative type liquid crystal having negative dielectric anisotropy or positive type liquid crystal having positive dielectric anisotropy.

Alignment films 124, 224 may be an alignment film subjected to a rubbing alignment treatment, or an optical alignment film subjected to an optical alignment treatment.

A laminate structure of each unit constituting pixel 14 is not limited to the configurations in FIGS. 3 and 4, but any known configuration can be adopted. As described above, liquid crystal display device 1 has the configuration of an in-plane switching (IPS) system. The configuration of liquid crystal display device 1 is not limited to the above configuration.

Returning to FIG. 1, a detection transistor that detects threshold voltage Vth of pixel transistor 13 is provided in non-display region 10b of display panel 10. The detection transistor includes monitor transistor 21 and reference transistor 31. Lead-out wire 22 electrically connected to monitor transistor 21 is electrically connected to external terminal 23, and lead-out wire 32 electrically connected to reference transistor 31 is electrically connected to external terminal 33. Monitor transistor 21 and reference transistor 31 are not electrically connected to source line 11 and gate line 12. Sizes (channel length L and channel width W) of monitor transistor 21 and reference transistor 31 are equal to a size (channel length L and channel width W) of pixel transistor 13. Monitor transistor 21 and reference transistor 31 are disposed close to each other.

Figure 5:
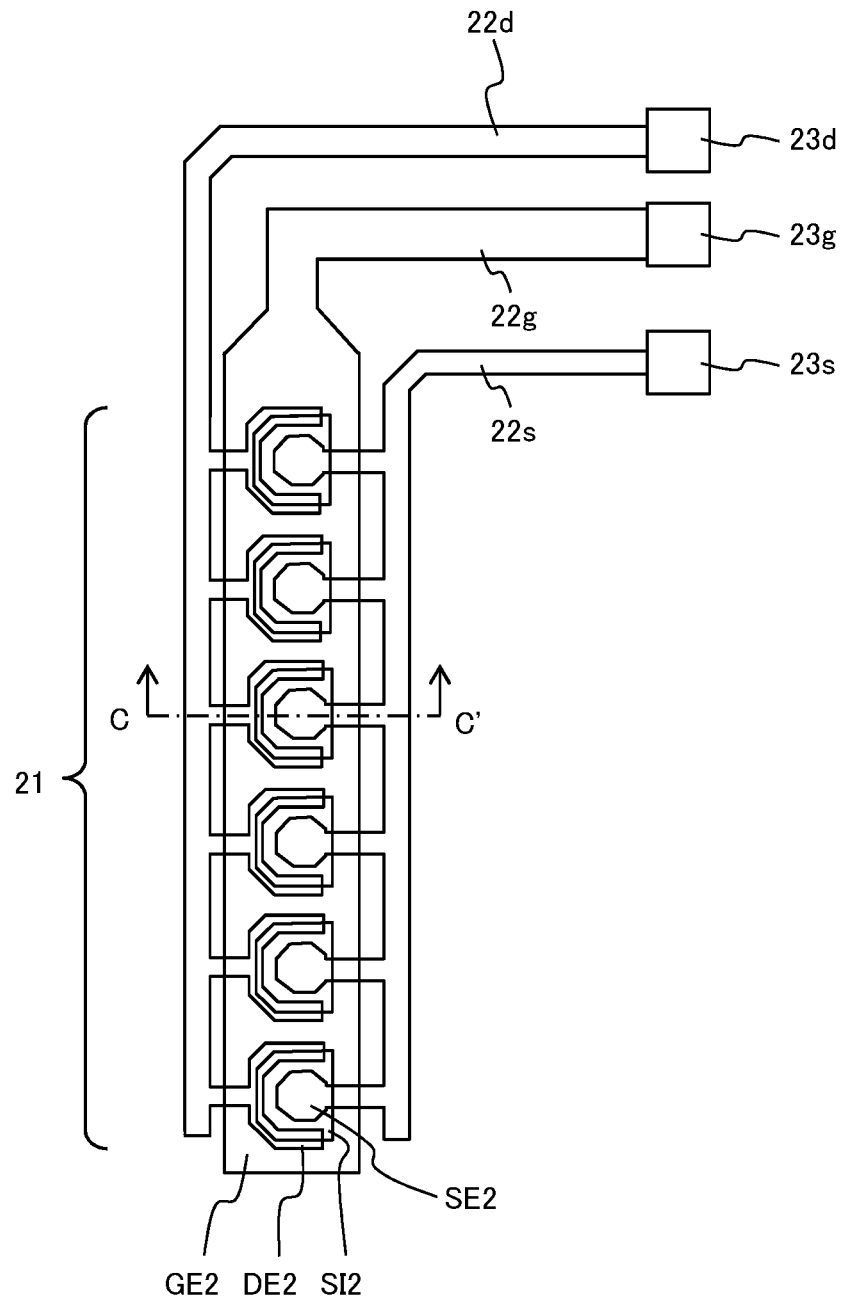
FIG. 5 is a plan view illustrating a configuration of monitor transistor.

FIG. 5 is a plan view illustrating a configuration of monitor transistor 21. Monitor transistor 21 includes a plurality of (in this case, six) thin film transistors. In each thin film transistor of monitor transistor 21, drain electrode DE2 is electrically connected to lead-out wire 22d, source electrode SE2 is electrically connected to lead-out wire 22s, and gate electrode GE2 is electrically connected to lead-out wire 22g. In planar view, semiconductor layer SI2 overlaps gate electrode GE2, and a part of drain electrode DE2 and a part of source electrode SE2 overlap semiconductor layer SI2. Lead-out wire 22d is electrically connected to external terminal 23d, lead-out wire 22s is electrically connected to external terminal 23s, and lead-out wire 22g is electrically connected to external terminal 23g.

Figure 6:
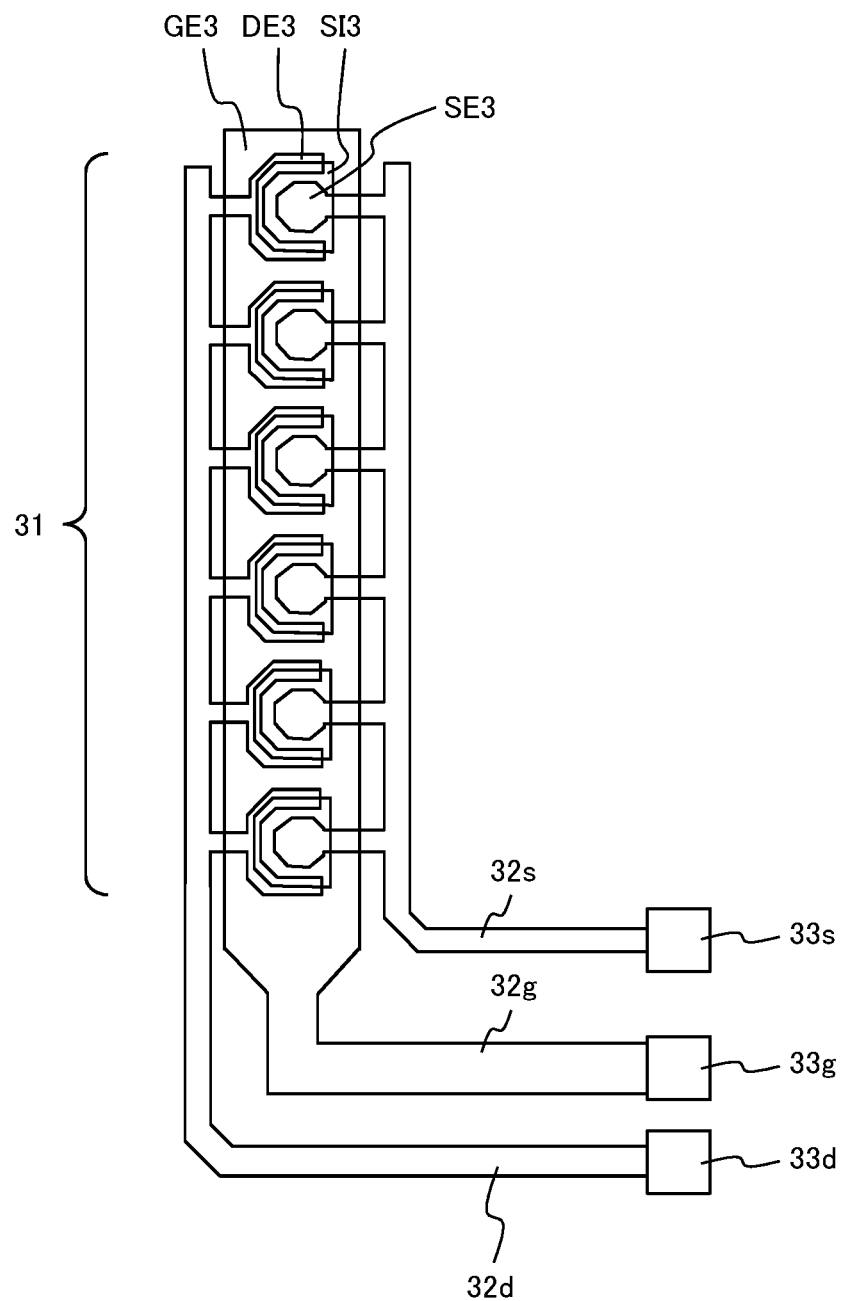
FIG. 6 is a plan view illustrating a configuration of reference transistor.

FIG. 6 is a plan view illustrating a configuration of reference transistor 31. Reference transistor 31 includes a plurality of (in this case, six) thin film transistors. In each thin film transistor of reference transistor 31, drain electrode DE3 is electrically connected to lead-out wire 32d, source electrode SE3 is electrically connected to lead-out wire 32s, and gate electrode GE3 is electrically connected to lead-out wire 32g. In planar view, semiconductor layer SI3 overlaps gate electrode GE3, and a part of drain electrode DE3 and a part of source electrode SE3 overlap semiconductor layer SI3. Lead-out wire 32d is electrically connected to external terminal 33d, lead-out wire 32s is electrically connected to external terminal 33s, and lead-out wire 32g is electrically connected to external terminal 33g.

Figure 7:
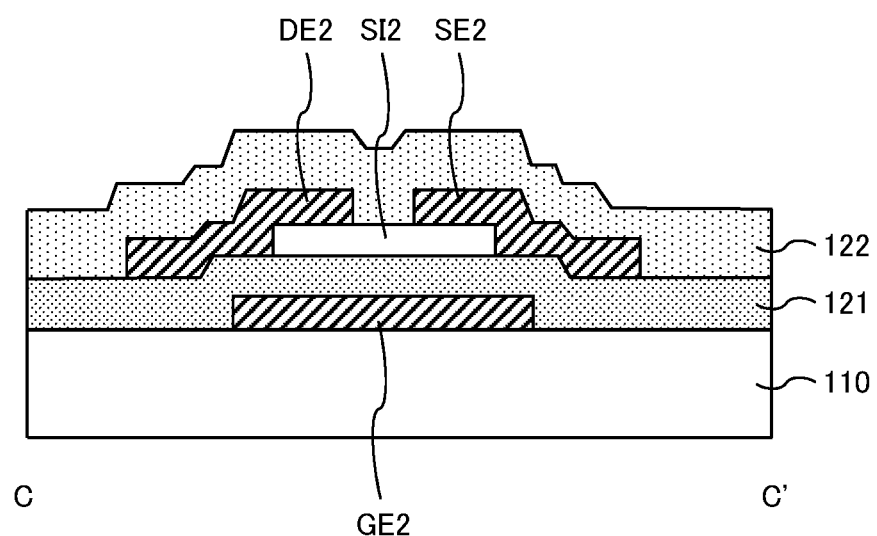
FIG. 7 is a sectional view taken along line C-C' in FIG. 5.

FIG. 7 is a sectional view taken along line C-C' in FIG. 5, and illustrates a part of a sectional configuration of monitor transistor 21 and reference transistor 31. Gate electrode GE2 is formed on the display surface side of glass substrate 110, and insulating film 121 is formed to cover gate electrode GE2. Semiconductor layer SI2, drain electrode DE2 partially overlapping semiconductor layer SI2, and source electrode SE2 partially overlapping semiconductor layer SI2 are formed on insulating film 121, and insulating film 122 is formed to cover Semiconductor layer SI2, drain electrode DE2, and source electrode SE2. Monitor transistor 21 and reference transistor 31 are formed through the same process as pixel transistor 13. Similarly to the pixel configuration (see FIGS. 3 and 4) of display region 10a, common electrode 16, insulating film 123, pixel electrode 15, and the like may be formed on insulating film 122. Monitor transistor 21 and reference transistor 31 may be a thin film transistor included in what is called a dummy pixel. Under the same conditions as pixel transistor 13, monitor transistor 21 is irradiated with light, and voltage is applied to monitor transistor 21. The numbers of monitor transistors 21 and reference transistors 31 are not limited to six, and an appropriate number may be selected according to detection sensitivity or an upper limit value of current of correction circuit 500 (to be described later). Each of pixel transistor 13, monitor transistor 21, and reference transistor 31 includes a gate electrode, a semiconductor layer, a source electrode, and a drain electrode that are made of the same material in the same layer. Monitor transistor 21 and reference transistor 31 are not electrically connected to pixel electrode 15, and are not electrically connected to source driver SD and gate driver GD.

Figure 8:
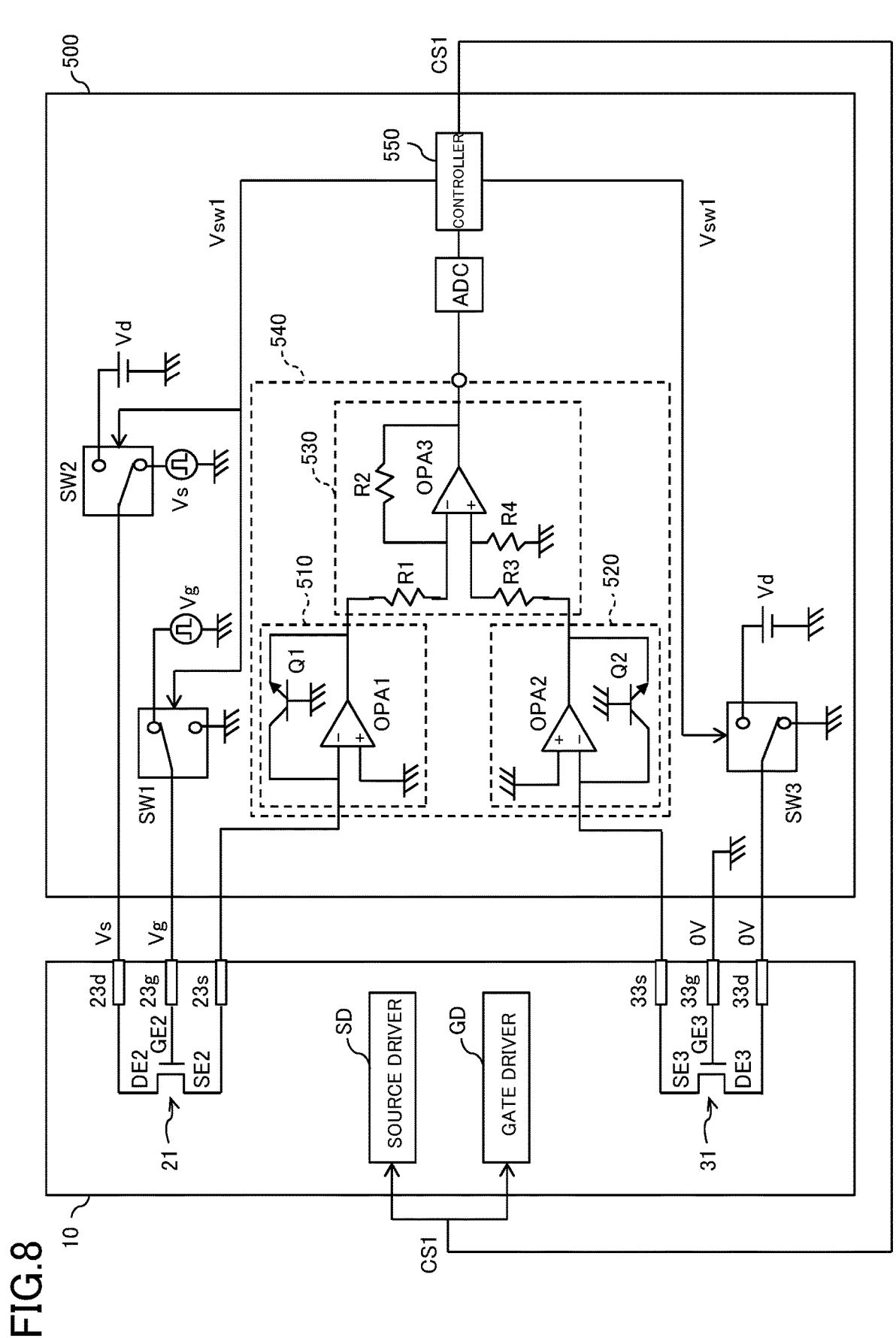
FIG. 8 is a view illustrating a configuration of correction circuit according to the exemplary embodiment.

A specific configuration of correction circuit 500 that corrects a shift of the threshold voltage of pixel transistor 13 will be described below. Using monitor transistor 21 and reference transistor 31, correction circuit 500 detects a shift amount of the threshold voltage of pixel transistor 13, and corrects the shift of the threshold voltage. FIG. 8 is a view illustrating a configuration of correction circuit 500. Correction circuit 500 includes logarithmic conversion circuits 510, 520, differential circuit 530, A/D conversion circuit ADC, controller 550, and switches SW1, SW2, SW3. Logarithmic conversion circuits 510, 520 and differential circuit 530 constitute detector 540 that detects shift amount ΔVth of threshold voltage Vth of monitor transistor 21. The output terminal of switch SW1 is connected to external terminal 23g, the output terminal of switch SW2 is connected to external terminal 23d, and the output terminal of switch SW3 is connected to external terminal 33d. External terminal 33g is connected to the ground (0 V) (constant voltage source). The input terminal of logarithmic conversion circuit 510 is connected to external terminal 23s, and the input terminal of logarithmic conversion circuit 520 is connected to external terminal 33s. The output terminal of logarithmic conversion circuit 510 is connected to a first input terminal (inverting input terminal) of differential circuit 530, and the output terminal of logarithmic conversion circuit 520 is connected to a second input terminal (non-inverting input terminal) of the differential circuit 530. The output terminal of differential circuit 530 is connected to the input terminal of A/D conversion circuit ADC, and the output terminal of A/D conversion circuit ADC is connected to the input terminal of controller 550. The output terminal of controller 550 is connected to the input terminals of switches SW1, SW2, SW3 and the input terminals of source driver SD and gate driver GD. Controller 550 may be provided in a timing controller (not illustrated).

FIG. 8 illustrates a state (normal mode) in which a normal display operation is performed. For example, when receiving an operation to power on liquid crystal display device 1, controller 550 outputs control signal CS1 to source driver SD and gate driver GD, and outputs switching signal Vsw1 to each of switches SW1, SW2, SW3. When receiving control signal CS1 from controller 550 and receiving image data and timing signals (start pulse, clock, and the like) from the timing controller, source driver SD performs known processing to output data signal Vs (gradation voltage) to source line 11. When receiving control signal CS1 from controller 550 and receiving timing signals (start pulse, clock, and the like) from the timing controller, gate driver GD performs known processing to sequentially output gate signal Vg (gate on voltage Vgh, gate-off voltage Vgl) to gate line 12. Thus, the normal display operation is performed in the normal mode.

When receiving switching signal Vsw1 from controller 550, switch SW1 electrically connects the input terminal of gate signal Vg to external terminal 23g of display panel 10. When receiving switching signal Vsw1 from controller 550, switch SW2 electrically connects the input terminal of data signal Vs to external terminal 23d of display panel 10. Gate signal Vg input to switch SW1 is the same signal as gate signal Vg (gate-on voltage Vgh, gate-off voltage Vgl) output from gate driver GD to gate line 12, and data signal Vs input to switch SW2 is the same signal as data signal Vs (gradation voltage) output from source driver SD to source line 11. Consequently, for example, a gate signal (gate-on voltage Vgh) is applied to gate electrode GE2 of monitor transistor 21 once in one frame to turn on monitor transistor 21, and data signal Vs is applied to drain electrode DE2 of monitor transistor 21. That is, in the normal mode, monitor transistor 21 performs the same operation as pixel transistor 13. The same voltage as one of pixel transistors 13 in the display region may be applied as data signal Vs applied to monitor transistor 21, and a specific voltage (for example, half-tone voltage) may be applied regardless of the input signal. Monitor transistor 21 is disposed in the same environment as pixel transistor 13, such as a temperature environment or a voltage application environment. For this reason, when the threshold voltage of pixel transistor 13 is shifted (varied), the threshold voltage of monitor transistor 21 is also shifted, and the shift amounts ΔVth of the threshold voltages become substantially equal to each other. Thus, the shift amount of the threshold voltage of pixel transistor 13 can substantially be detected by detecting shift amount ΔVth of threshold voltage Vth of monitor transistor 21.

When receiving switching signal Vsw1 from controller 550, switch SW3 electrically connects the ground (0 V) to external terminal 33d of display panel 10. Because the voltage is not applied to reference transistor 31, threshold voltage Vth of reference transistor 31 is not shifted.

Figure 9:
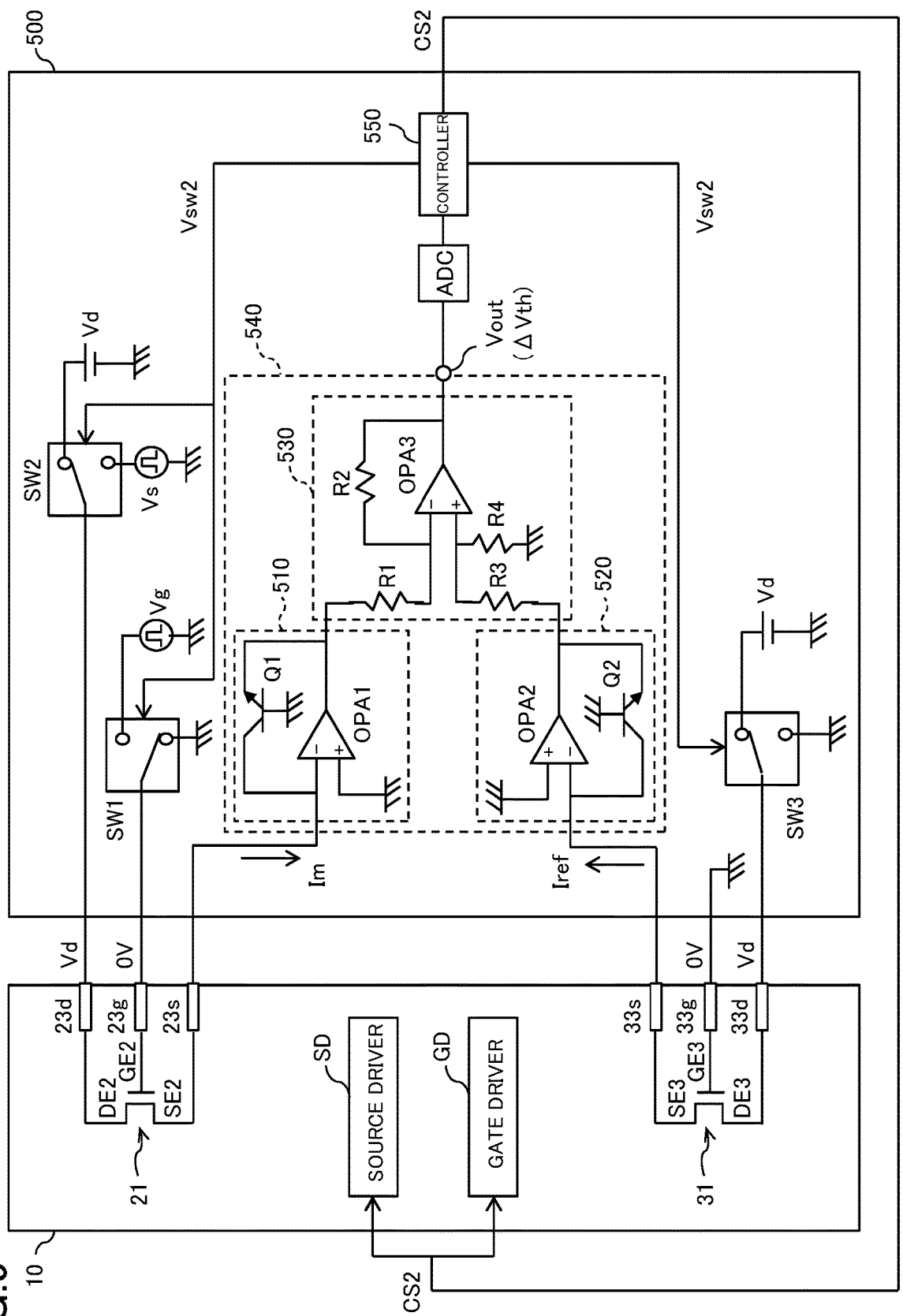
FIG. 9 is a view illustrating a configuration of correction circuit according to the exemplary embodiment.

FIG. 9 illustrates a state (correction mode) in which the shift of the threshold voltage of pixel transistor 13 is corrected. For example, when receiving an operation to power off liquid crystal display device 1, controller 550 outputs switching signal Vsw2 to each of switches SW1, SW2, SW3.

When receiving switching signal Vsw2 from controller 550, switch SW1 electrically connects the ground (0 V) to external terminal 23g of display panel 10. When receiving switching signal Vsw2 from controller 550, switch SW2 electrically connects a power supply (power supply voltage Vd) to external terminal 23d of display panel 10. Power supply voltage Vd input to switch SW2 is set to a predetermined voltage (for example, 10 V). When receiving switching signal Vsw2 from controller 550, switch SW3 electrically connects the power supply (power supply voltage Vd) to external terminal 33d of display panel 10. Power supply voltage Vd input to switch SW3 is set to the same predetermined voltage (10 V, for example) as power supply voltage Vd input to switch SW2.

As described above, in the correction mode, drain-source voltage Vds is set to 10 V and gate-source voltage Vgs is set to 0 V in each of monitor transistor 21 and reference transistor 31. Consequently, drain current Im due to subthreshold characteristic of monitor transistor 21 is input to logarithmic conversion circuit 510, and drain current Iref due to a subthreshold characteristic of reference transistor 31 is input to logarithmic conversion circuit 520. When currents Im, Iref are input to detector 540 constructed with logarithmic conversion circuits 510, 520 and differential circuit 530, detector 540 calculates output voltage Vout based on the following known equation (1). Output voltage Vout represents shift amount ΔVth of threshold voltage Vth of monitor transistor 21.

$$Vout = (kT/q)\ln(10)\log_{10}(Im/Iref) \quad (1)$$

$k = 1.381 \times 10^{-23}$ J/K
T = absolute temperature (K)
$q = 1.602 \times 10^{-19\circ}$ C.

Shift amount ΔVth detected by detector 540 is input to the controller 550 after subjected to analog-digital conversion using A/D conversion circuit ADC. Controller 550 determines whether shift amount ΔVth is larger than a preset reference voltage, and outputs control signal CS2 correcting the shift of the threshold voltage of pixel transistor 13 to source driver SD and gate driver GD when shift amount ΔVth is larger than the reference voltage. When receiving control signal CS2 from controller 550, source driver SD outputs a predetermined voltage (for example, Vcom) to each source line 11 only for predetermined period Tp (for example, 10 to 60 seconds). When receiving control signal CS2 from controller 550, gate driver GD outputs the correction voltage (for example, gate-on voltage Vgh) to each gate line 12 only for predetermined period Tp (for example, 10 to 60 seconds). Consequently, the correction voltage (gate-on voltage Vgh) is applied to gate electrode GE1 of pixel transistor 13 (see FIG. 2) only for predetermined period Tp (for example, 10 to 60 seconds), and Vcom is applied to drain electrode DE1 only for predetermined period Tp (for example, 10 to 60 seconds). Thus, for example, when the threshold voltage of pixel transistor 13 is shifted in a negative direction, the correction voltage is applied to shift the threshold voltage in a positive direction, which allows the correction of the threshold voltage. When shift amount ΔVth is larger than the reference voltage, controller 550 further outputs switching signal Vsw1 (see FIG. 8) to each of switches SW1, SW2, SW3. Consequently, similarly to pixel transistor 13, gate signal Vg (correction voltage; gate-on voltage Vgh) is applied to gate electrode GE2 of monitor transistor 21 only for predetermined period Tp (for example, 10 to 60 seconds), and the data signal Vs (Vcom) is supplied to drain electrode DE2 only for predetermined period Tp (for example, 10 to 60 seconds).

Figure 10:
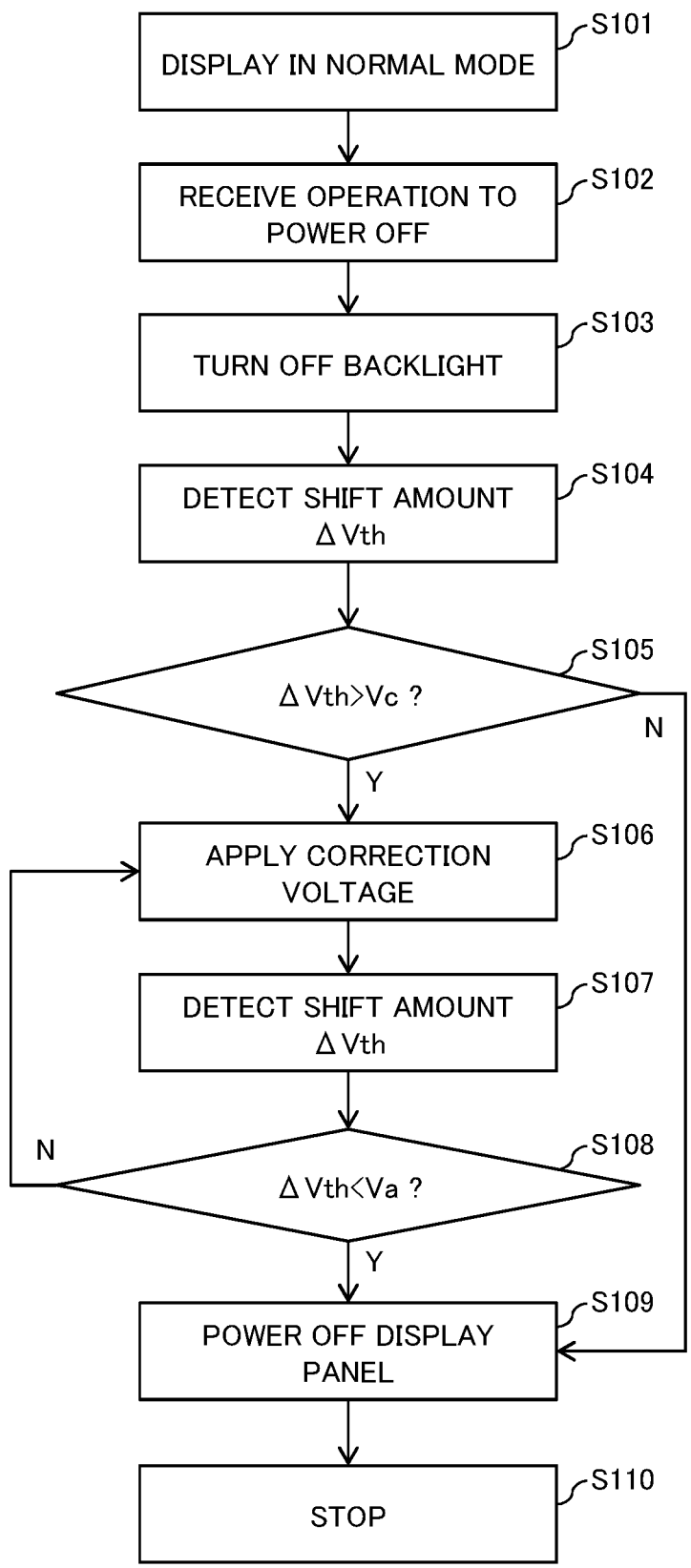
FIG. 10 is a flowchart illustrating an action example of the correction mode.
Figure 11:
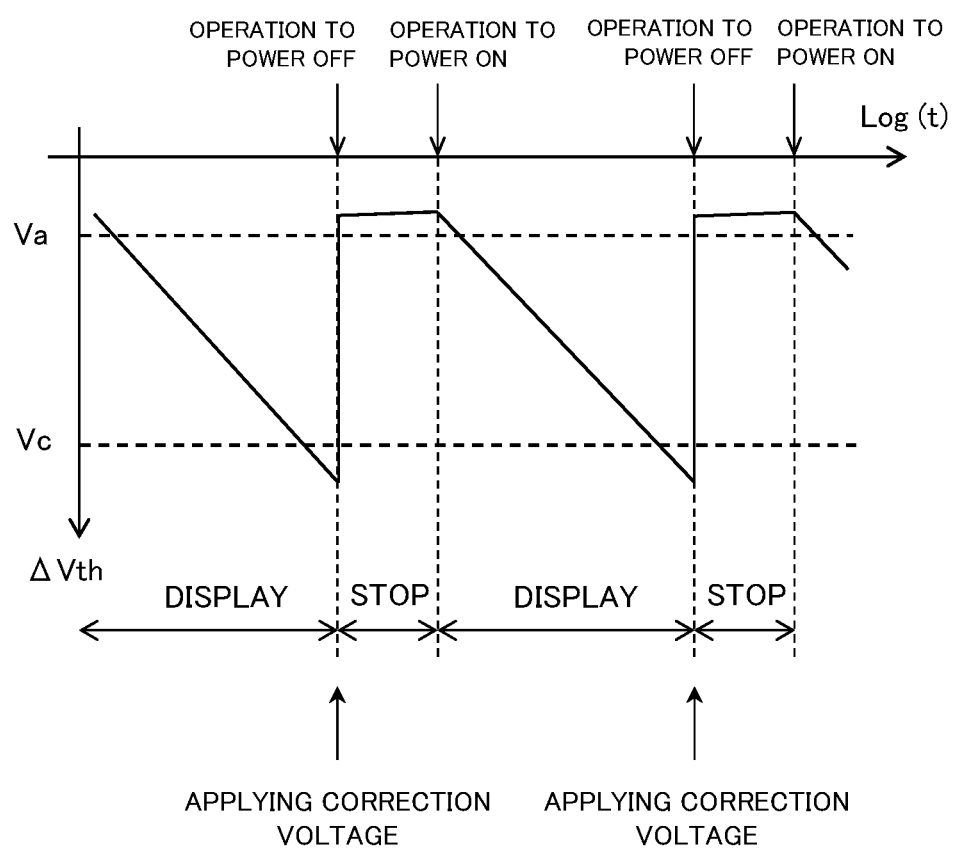
FIG. 11 is a graph illustrating a time change of shift amount of threshold voltage at monitor transistor.

A specific action example in the correction mode will be described below. FIG. 10 is a flowchart illustrating an action example of the correction mode. FIG. 11 is a graph illustrating a time change of shift amount ΔVth of threshold voltage Vth at monitor transistor 21. FIG. 11 illustrates the state in which the power supply of the liquid crystal display device is repeatedly turned on and off.

Liquid crystal display device 1 performs the display action in the normal mode (S101). When receiving the operation to power off liquid crystal display device 1 (S102), liquid crystal display device 1 turns off the backlight (S103). Subsequently, detector 540 (logarithmic conversion circuits 510, 520 and differential circuit 530) of correction circuit 500 detects shift amount ΔVth of threshold voltage Vth of monitor transistor 21 (S104). Subsequently, controller 550 of correction circuit 500 determines whether shift amount ΔVth is larger than first reference voltage Vc (see FIG. 11) (S105). When shift amount ΔVth is larger than first reference voltage Vc (YES in S105), controller 550 outputs control signal CS2 to source driver SD and gate driver GD to apply the correction voltage (gate on voltage Vgh) to pixel transistor 13, and outputs switching signal Vsw1 (see FIG. 8) to switches SW1, SW2, SW3 to apply the correction voltage (gate-on voltage Vgh) to monitor transistor 21 (S106). Subsequently, controller 550 outputs switching signal Vsw2 (see FIG. 9) to switches SW1, SW2, SW3 again to detect shift amount ΔVth (S107). Controller 550 determines whether shift amount ΔVth is smaller than second reference voltage Va (see FIG. 11) (S108). When shift amount ΔVth is smaller than second reference voltage Va (YES in S108), liquid crystal display device 1 powers off display panel 10 (S109), and stops (S110). When shift amount ΔVth is greater than or equal to second reference voltage Va (NO in S108), the processing returns to S106 to apply the correction voltage again. When shift amount ΔVth is less than or equal to first reference voltage Vc (NO in S105), the processing goes to S109, liquid crystal display device 1 powers off display panel 10 (S109), and stops (S110).

Gate driver GD may sequentially supply the correction voltage to gate lines 12, or simultaneously supply the correction voltage to gate lines 12.

Figure 12:
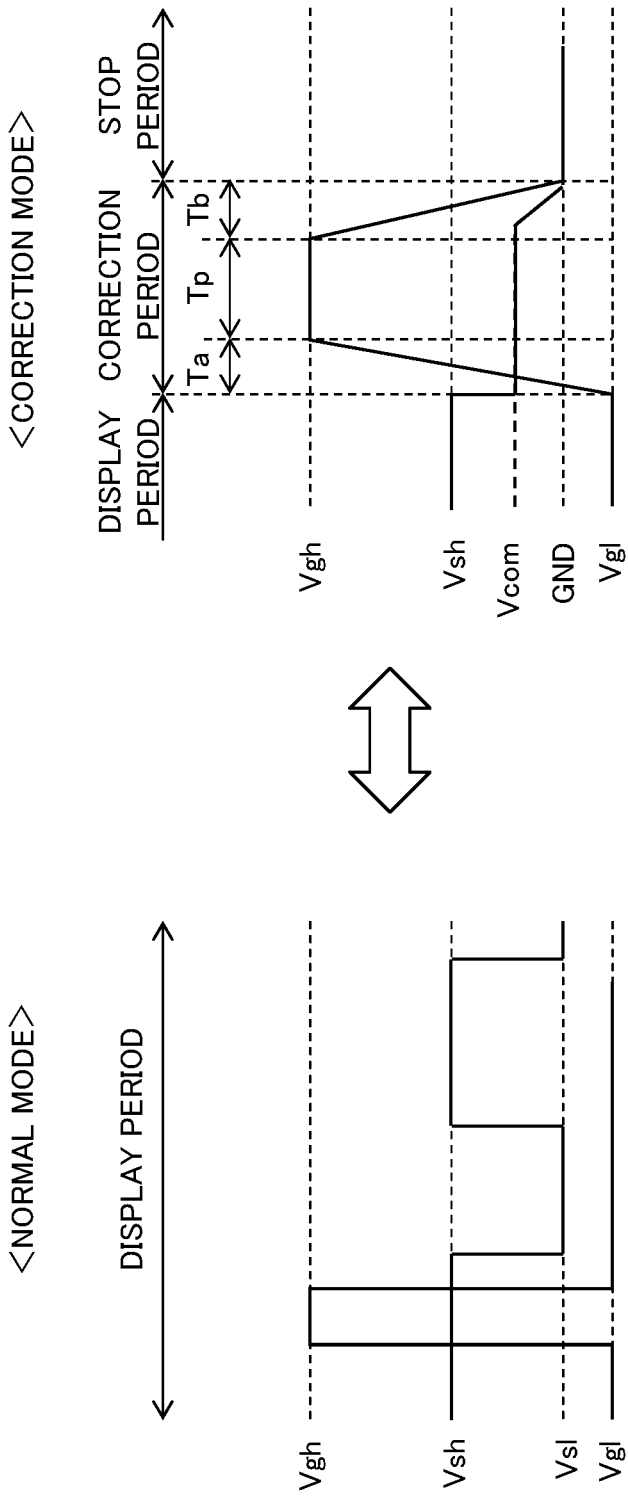
FIG. 12 is a view illustrating signal waveforms of the voltages applied to pixel transistor in the normal mode and the correction mode.

The correction voltage applied to gate electrode GE1 of pixel transistor 13 will be described below. FIG. 12 is a view illustrating signal waveforms of the voltages applied to pixel transistor 13 in the normal mode and the correction mode. In the correction mode, the signal waveform of the correction voltage applied to gate electrode GE1 of pixel transistor 13 inclines from potential Vgl toward potential Vgh in initial period Ta (rising), maintains potential Vgh in subsequent period Tp, and incline from potential Vgh toward the potential Vgl in final period Tb (falling). A burnout of the circuit terminal can be prevented by providing the inclined period.

Figure 13:
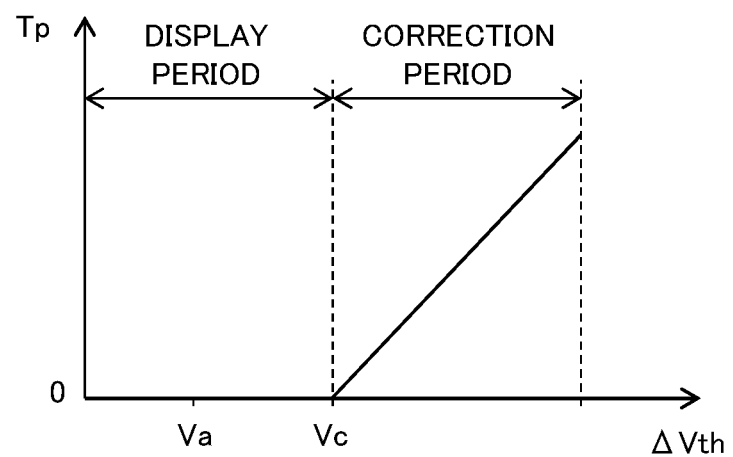
FIG. 13 is a graph illustrating relationship of shift amount of threshold voltage and correction period.

As illustrated in FIG. 13, a length of period Tp (correction period) may be set according to shift amount ΔVth of threshold voltage Vth. For example, period Tp is set such that period Tp becomes longer with increasing shift amount ΔVth. Consequently, the shift of threshold voltage Vth can certainly be corrected.

Figure 14:
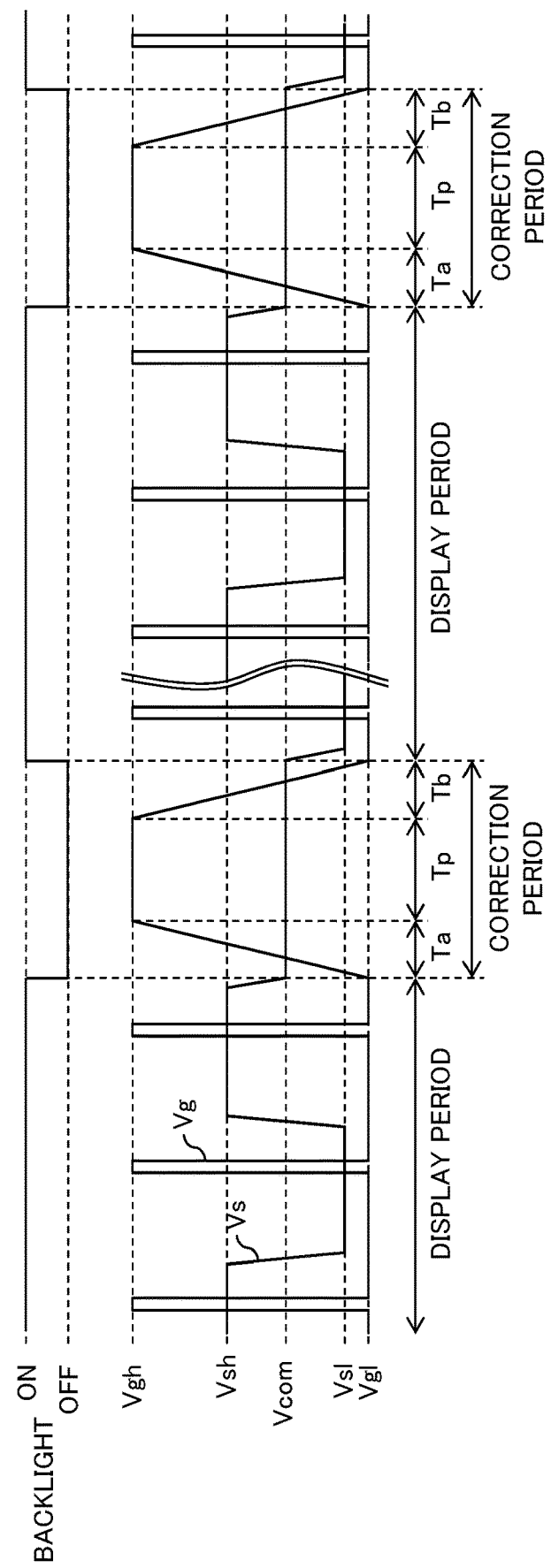
FIG. 14 is a timing chart illustrating a state of display period and correction period.
Figure 15:
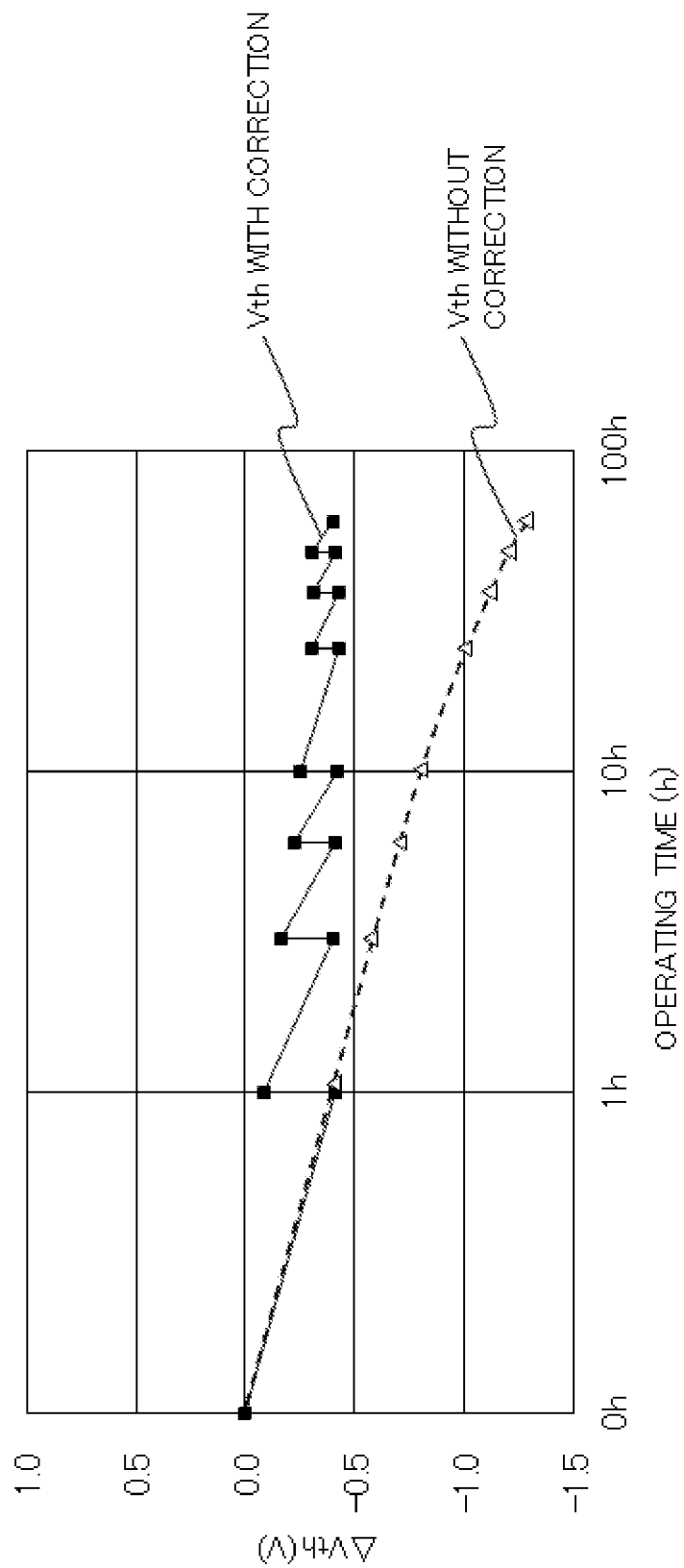
FIG. 15 is a graph illustrating relationship of operating time and threshold voltage.

In the above configuration, the processing of detecting the shift amount of the threshold voltage of pixel transistor 13 and the processing (correction mode) of correcting the shift amount of the threshold voltage of pixel transistor 13 are performed when the operation to power off liquid crystal display device 1 is received. However, the present invention is not limited the above configuration. For example, the processing of the correction mode may be performed when the operation to power on liquid crystal display device 1 is received. As illustrated in FIG. 14, the processing of the correction mode may be performed in a period between the display actions. For example, the processing of the correction mode may be performed in a blanking period of a predetermined frame. FIG. 15 illustrates the state in which the processing of the correction mode is repeated between display actions. As can be seen from FIG. 15, the shift of threshold voltage Vth can be prevented by performing the correction processing.

Figure 16:
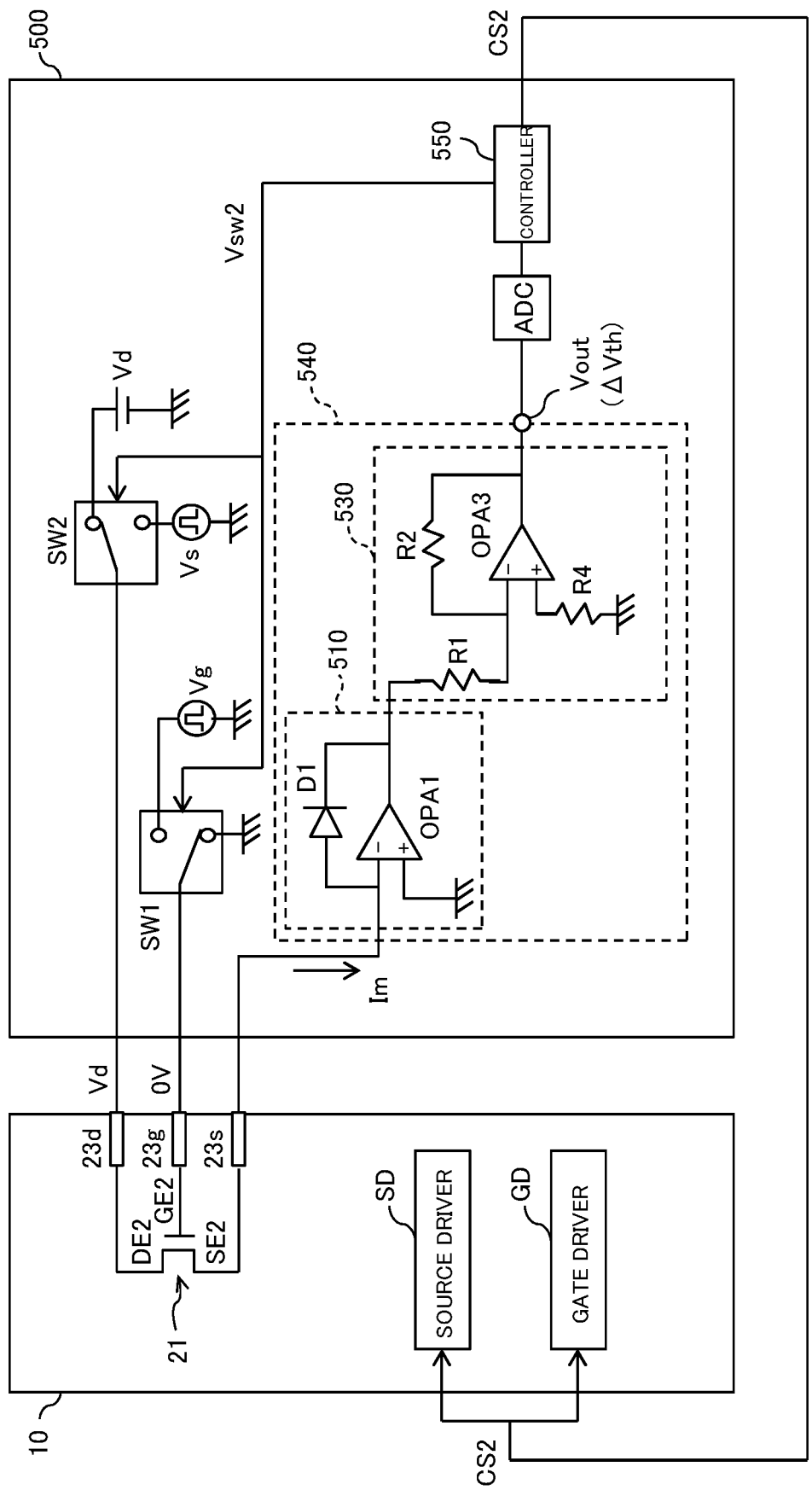
FIG. 16 is a view illustrating another configuration of the liquid crystal display device according to the exemplary embodiment.

Liquid crystal display device 1 of the present invention is not limited to the above configuration. For example, as illustrated in FIG. 16, reference transistor 31 may be omitted in display panel 10, and detector 540 of correction circuit 500 may be constructed with logarithmic conversion circuit 510 and differential circuit 530. The first input terminal of differential circuit 530 is connected to the output terminal of logarithmic conversion circuit 510, and the second input terminal is connected to the ground through resistor R4. Detector 540 detects shift amount ΔVth of threshold voltage Vth of monitor transistor 21 based on drain current Im.

Figure 17:
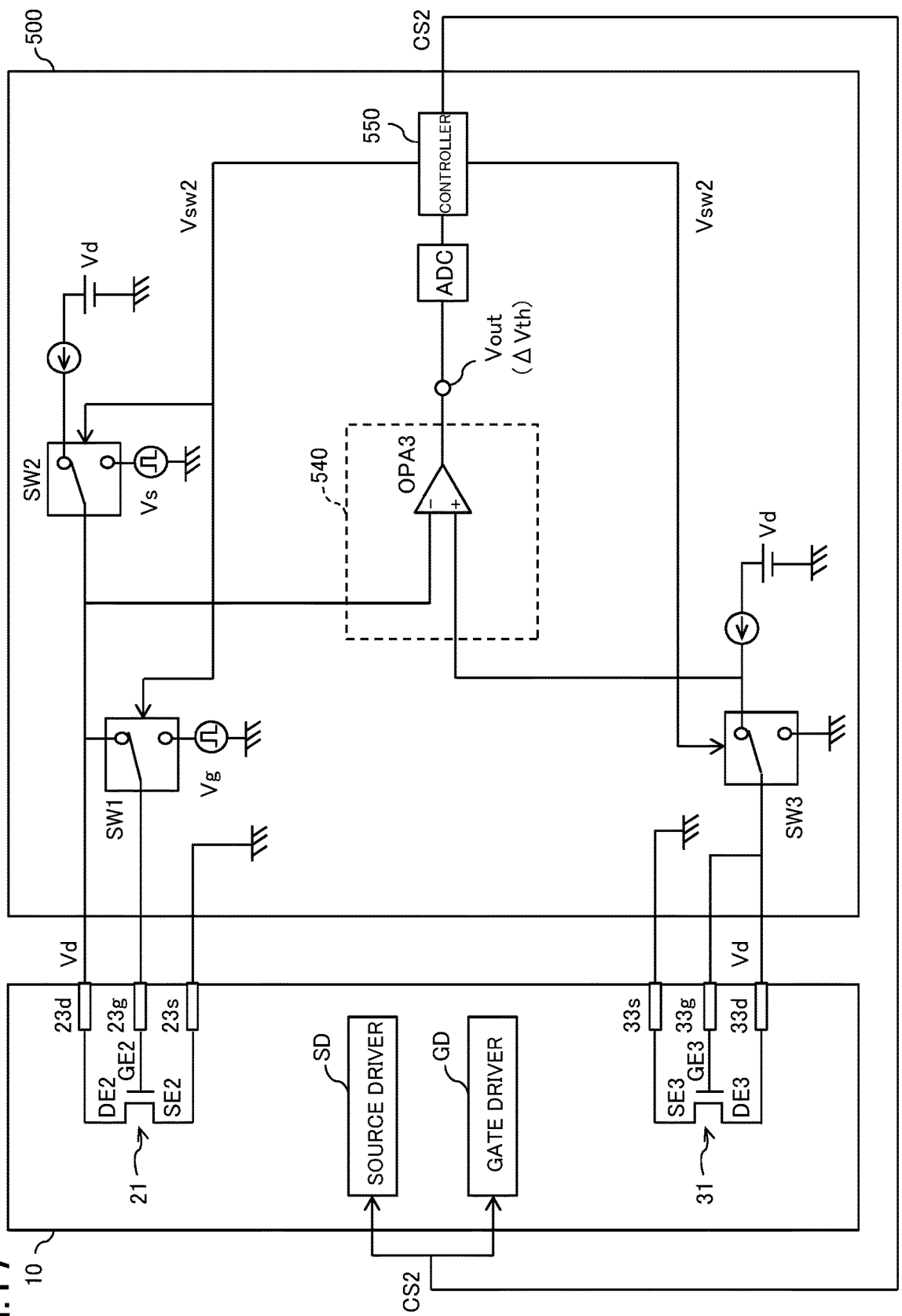
FIG. 17 is a view illustrating another configuration of the liquid crystal display device according to the exemplary embodiment.

FIG. 17 illustrates another configuration of correction circuit 500. In correction circuit 500 of FIG. 17, logarithmic conversion circuits 510, 520 are omitted, and detector 540 is constructed with operational amplifier OPA3. In the correction mode, when switching signal Vsw2 is input to switches SW1, SW2, gate electrode GE2 and drain electrode DE2 of monitor transistor 21 are connected to each other (diode-connected), connected to a constant current source, and connected to the inverting input terminal of operational amplifier OPA3. When switching signal Vsw2 is input to switch SW3, gate electrode GE3 and drain electrode DE3 of reference transistor 31 are connected to each other (diode-connected), connected to the constant current source, and connected to the noninverting input terminal of operation amplifier OPA3. Detector 540 (operational amplifier OPA3) detects shift amount ΔVth (Vout) of threshold voltage Vth of monitor transistor 21 based on the drain voltage input from monitor transistor 21 and the drain voltage input from reference transistor 31. In the above configuration, because shift amount ΔVth can be detected when threshold voltage Vth of monitor transistor 21 has a positive value, preferably the condition of the correction voltage applied to pixel transistor 13 and monitor transistor 13 is set such that shift amount ΔVth does not become a negative value.

When shift amount ΔVth of threshold voltage Vth of monitor transistor 21 becomes larger than the reference voltage (for example, Vc in FIG. 11) during the display action (normal mode), liquid crystal display device 1 may display a warning display image such as a message encouraging a user to power off liquid crystal display device 1 on display panel 10.

Liquid crystal display device 1 may be configured to detect shift amount ΔVth of threshold voltage Vth of monitor transistor 21 when a temperature of display panel 10 is increased.

In the above, the specific embodiments of the present application have been described, but the present application is not limited to the above-mentioned embodiments, and various modifications may be made as appropriate without departing from the spirit of the present application.

The invention claimed is:

1. A display device comprising:
a plurality of source lines;
a plurality of gate lines;
a source driver that supplies a data signal to each of the plurality of source lines;
a gate driver that supplies a gate signal to each of the plurality of gate lines;
a plurality of pixel transistors electrically connected to the respective source lines and the respective gate lines;
a monitor transistor in which a lead-out wiring of a drain electrode is electrically connected to a first external terminal, a lead-out wiring of a gate electrode is electrically connected to a second external terminal, and a lead-out wiring of a source electrode is electrically connected to a third external terminal;
a reference transistor in which a lead-out wiring of a drain electrode is electrically connected to a fourth external terminal, a lead-out wiring of a gate electrode is electrically connected to a fifth external terminal, and a lead-out wiring of a source electrode is electrically connected to a sixth external terminal; and
a detector that is electrically connected to the third external terminal and the sixth external terminal to detect a shift amount of a threshold voltage of the monitor transistor.

2. The display device according to claim 1, wherein a first mode in which an image is displayed and a second mode in which the shift amount of the threshold voltage of the monitor transistor is detected are included,
in the first mode, the data signal is applied to the drain electrode of the monitor transistor, the gate signal is applied to the gate electrode of the monitor transistor, and the lead-out wirings of the drain electrode and the gate electrode of the reference transistor are connected to a constant voltage source, and
in the second mode, a predetermined voltage is applied to the drain electrode of each of the monitor transistor and the reference transistor, the lead-out wire of the gate electrode of each of the monitor transistor and the reference transistor is connected to a constant voltage source, and the detector detects the shift amount based on a drain current of each of the monitor transistor and the reference transistor.

3. The display device according to claim 1, further comprising a controller that applies a correction voltage to the plurality of pixel transistors based on the shift amount,
wherein the controller applies the correction voltage to the gate electrode of each of the plurality of pixel transistors when the shift amount is larger than a first reference voltage.

4. The display device according to claim 3, wherein the controller sets an application period of the correction voltage longer with increasing shift amount.

5. The display device according to claim 3, wherein a signal waveform of the correction voltage has an inclined rising period and an inclined falling period.

6. The display device according to claim 3, wherein the controller outputs a control signal to the source driver and the gate driver when the shift amount is larger than a first reference voltage,
the source driver outputs a common voltage to the respective source lines only for a predetermined period when the source driver receives the control signal, and
the gate driver outputs the correction voltage to the respective gate lines only for the predetermined period when the gate driver receives the control signal.

7. The display device according to claim 3, wherein the processing of applying the correction voltage to the gate electrode of each of the plurality of pixel transistors using the controller is performed after an operation to power off the display device is received.

8. The display device according to claim 3, wherein in processing of applying the correction voltage to the gate electrode of each of the plurality of pixel transistors using the controller, the controller sequentially supplies the correction voltage to the plurality of gate lines.

9. The display device according to claim 1, wherein the plurality of source lines, the plurality of gate lines, the source driver, the gate driver, the plurality of pixel transistors, the monitor transistor, and the reference transistor are provided in a display panel, and
the detector is provided outside the display panel.

10. The display device according to claim 9, wherein the monitor transistor and the reference transistor are disposed close to each other in a non-display region of the display panel.

11. The display device according to claim 1, wherein a first mode in which an image is displayed and a second mode in which the shift amount of the threshold voltage of the monitor transistor is detected are included,
in the first mode, the data signal is applied to the drain electrode of the monitor transistor, the gate signal is applied to the gate electrode of the monitor transistor, and the lead-out wirings of the drain electrode and the gate electrode of the reference transistor are connected to a constant voltage source, and
in the second mode, the drain electrode and the gate electrode of the monitor transistor are electrically connected to each other while electrically connected to a constant current source, the drain electrode and the gate electrode of the reference transistor are electrically connected to each other while electrically connected to the constant current source, and the detector detects the shift amount based on a drain voltage of each of the monitor transistor and the reference transistor.

* * * * *